United States Patent [19]

Campbell et al.

[11] Patent Number: 4,763,017
[45] Date of Patent: Aug. 9, 1988

[54] ELECTRONIC BIPOLAR INTERFACE CIRCUIT

[75] Inventors: Richard D. Campbell, Ormond Beach, Fla.; John O. G. Darrow, Murrysville, Pa.

[73] Assignee: American Standard Inc., North Hills, Pa.

[21] Appl. No.: 789,900

[22] Filed: Oct. 21, 1985

[51] Int. Cl.$^4$ .................... G05B 11/12; H03K 17/00
[52] U.S. Cl. .................... 307/262; 307/239; 307/475; 307/127; 363/63; 340/644
[58] Field of Search .............. 307/262, 239, 127, 128, 307/140, 475; 363/63; 340/644, 657

[56] References Cited

U.S. PATENT DOCUMENTS

| | | | |
|---|---|---|---|
| 3,371,223 | 2/1968 | Gilbert | 307/239 |
| 3,571,688 | 3/1971 | Tomasulo, Jr. et al. | 307/262 |
| 3,819,951 | 6/1974 | Moore | 307/262 |

FOREIGN PATENT DOCUMENTS 1028090  5/1966  United Kingdom .
1258442  12/1971  United Kingdom .

Primary Examiner—Stanley D. Miller
Assistant Examiner—Richard Roseen
Attorney, Agent, or Firm—J. B. Sotak

[57] ABSTRACT

An electronic bipolar interface driver circuit for interconnecting a microprocessor to an electromagnetic relay load. The driver circuit includes a peripheral adapter circuit having a pair of outputs connected to a respective one of the two inputs of a pair of NAND gates. A source of square-wave signals connected to the other inputs of the two input NAND gates so that a.c. signals are supplied to one of two switching amplifiers. The a.c. signals are transformer-coupled to a pair of rectifiers. The rectified d.c. voltage is supplied to either one of two switching transistors which establishes a given polarity of voltage on a pair of output terminals and which illuminates one of two optical couplers to feedback a checking signal to the peripheral adapter circuit to verify the polarity of the voltage on the output terminals.

18 Claims, 2 Drawing Sheets

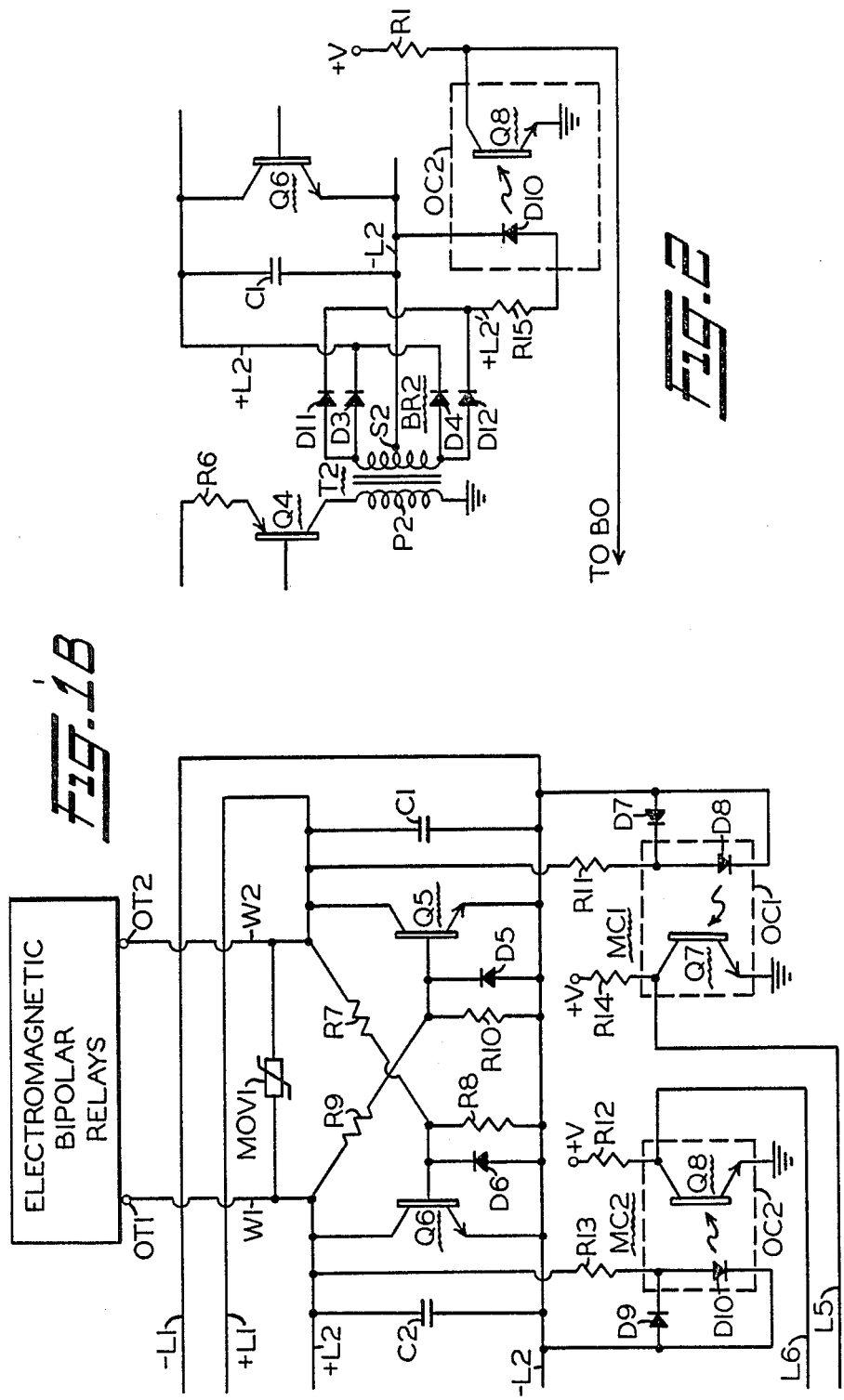

ELECTRONIC BIPOLAR INTERFACE CIRCUIT

FIELD OF THE INVENTION

This invention relates to a solid-state bipolar interface circuit for interconnecting a microprocessor to electromagnetic polarized relays and, more particularly, to an electronic interface driver circuit for generating a bipolar voltage on a pair of output terminals.

BACKGROUND OF THE INVENTION

In the past, railroad switch machines were normally controlled by electromagnetic polarized relays. Generally, a typical interlocking installation contains four polarized relays with the windings connected in parallel to a pair of line wires which supply the required control voltages. In a crossover switch layout, two of the electromagnetic relays are utilized to control a first one of two electric switch machines while two other electromagnetic relays are employed to control the second of the two electric switch machines. In practice, a first polarity of d.c. voltage is applied to the pair of line wires to cause both of the switch machines to move to their normal positions while a second or opposite polarity of d.c. voltage causes both of the switch machines to move to their reverse positions. Thus, when the switch machines are in their normal positions, the trains are permitted to go straight through on both tracks; and conversely, when the switch machines are in their reverse positions, the trains are permitted to cross over from one track to the other track. It will be appreciated that it is only necessary to supply the d.c. voltage of any given polarity to the respective relay during the time that the switch machines are moving the points from one position to the other position. Once the switch points are shifted and locked, the polarized d.c. voltage may be removed from the line wires. Previously, the control circuits of the switch machines were actuated by fail-safe relay logic. With the present state of the art, it has become advantageous and desirable to construct interlockings having polarized output relays which are controlled by electronic microprocessors. However, since microprocessors are not per se fail-safe devices, it is mandatory to develop a manner that monitoring signals are fed back to the microprocessor. Thus, these feedback signals permit a check that the desired action has indeed been initiated and completed. The switch machines are designed to cause the closure of an electrical contact when the switch points are driven to their extreme positions and are locked in place. This contact closure will be used by the microprocessor to check that the desired action has taken place as commanded by the driving circuit.

OBJECTS AND SUMMARY OF THE INVENTION

Accordingly, it is an object of this invention to provide a new and improved electronic interface circuit for interconnecting a microprocessor to an electromagnetic circuit.

Another object of this invention is to provide a novel, solid-state circuit for interfacing a computer cardfile to a vital input/output cardfile.

A further object of this invention is to provide a unique electronic interface driver circuit which is highly immune to electrical noise and lightning, extreme temperatures, high mechanical stress, and vibration.

Yet another object of this invention is to provide an interface driver circuit which generates a bipolar voltage on a pair of output wires.

Yet a further object of this invention is to provide an improved electronic interface driver circuit for producing a bipolar voltage on a pair of output terminals comprising, a peripheral interface adapter circuit conditioned by control data to establish a first and a second electrical state, a logic circuit having a first gate activated by the first electrical state and having a second gate activated by the second electrical state, a first switching amplifier connected to the first gate for generating a.c. signals when the first gate is activated and a second switching amplifier connected to the second gate for generating a.c. signals when the second gate is activated, a first rectifier for converting the a.c. signals of the first switching amplifier to a first d.c. voltage and a second rectifier for converting the a.c. signals of the second switching amplifier to a second d.c. voltage, a first switching circuit conditioned by the d.c. voltage to produce one polarity of voltage on the pair of output terminals and a second switching circuit conditioned by the second d.c. voltage to produce the opposite polarity of voltage on the pair of output terminals, and a monitoring circuit conditioned by the first and second d.c. voltage to verify the polarity of the voltage on the pair of output terminals.

Still another object of this invention is to provide a new and unique electronic bipolar interface circuit which is economical in construction, efficient in operation, reliable in service, and durable in use.

BRIEF DESCRIPTION OF THE DRAWINGS

The above objects and other attendant features and advantages of the present invention will be more readily understood from the following detailed description of the specification when considered in conjunction with the accompanying drawings, wherein:

FIGS. 1A and 1B, when placed in side-by-side relationship, illustrate a schematic circuit diagram of a solid-state bipolar interface relay driving circuit for polarized relays in accordance with the present invention; and FIG. 2 is a schematic circuit diagram of an alternative embodiment of developing a feedback signal for use in the circuit of FIGS. 1A and 1B.

DETAILED DESCRIPTION OF THE INVENTION

Figure 1A:
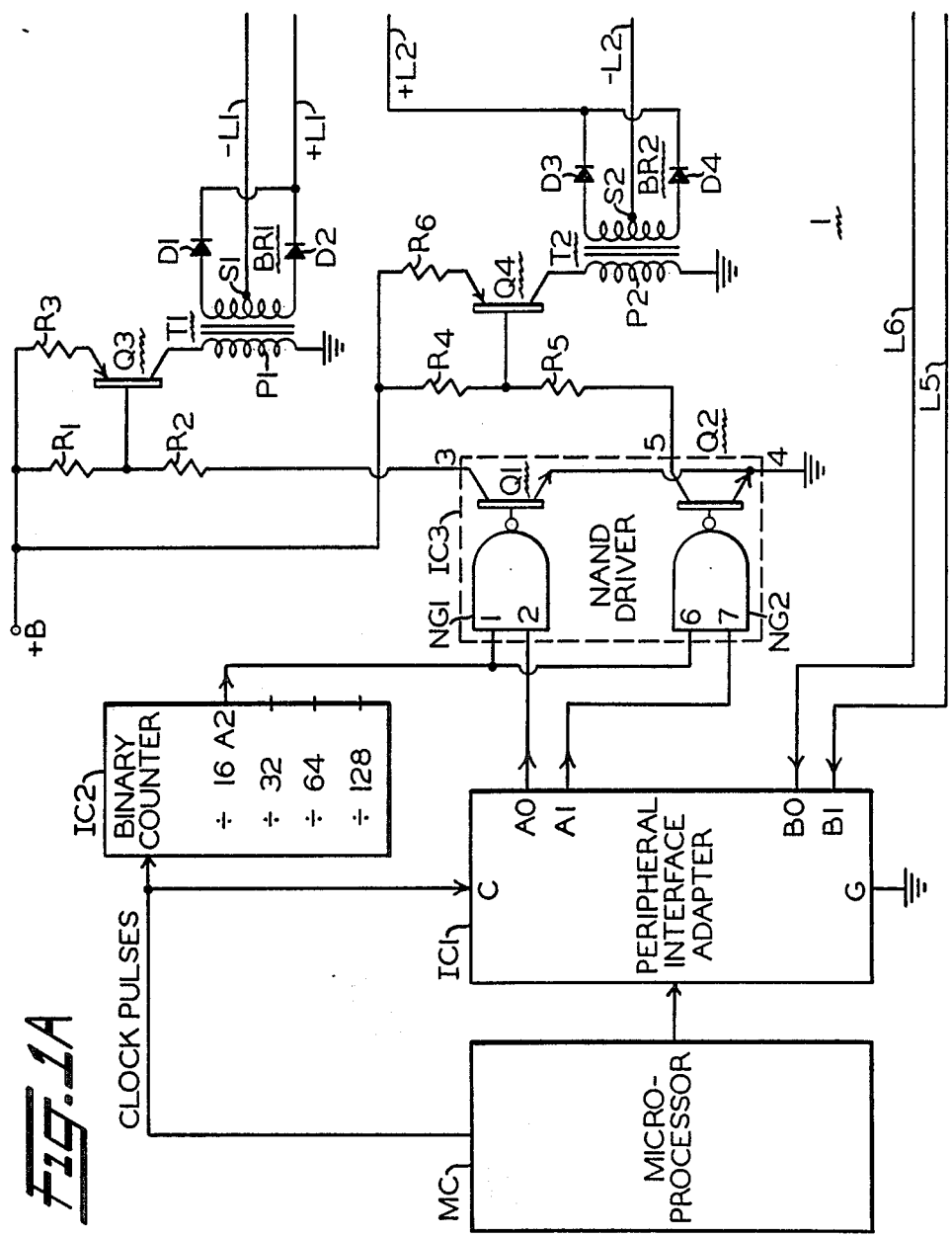

Referring now to the drawings, and in particular to FIGS. 1A and 1B, there is shown an electronic bipolar driver interface circuit which is generally characterized by the numeral 1. As shown, an integrated circuit IC1 is a peripheral interface adapter which is connected to a computer cardfile and is controlled by data produced by a microprocessor MC to cause the production of output data or command signals on a pair of output terminals A0 and A1. The peripheral interface circuit IC1 also includes a pair of input feedback signals supplied to terminals B0 and B1, the details of which will be described hereinafter. A 1 megahertz (MHZ) clock frequency signal is generated by the microprocessor and is supplied to terminal C of the peripheral adapter circuit IC1 which also has a ground terminal G. The clock frequency is also fed to the clock terminal C of an integrated circuit binary counter IC2 which divides the 1MHZ clock frequency down to 62.5 KHZ. Thus, the clock frequency is divided by a factor of 16 to obtain the 62.5 KHZ frequency. It will be seen that the binary counter IC2 also has capabilities of dividing ratios of 32, 64 and 128 to accommodate clock frequencies of 2, 4 and 8 MHZ. In practice, the output signals developed on terminal A2 are a square-wave voltage having a low or 0 value and a high or +5 volts value. The square-wave output clock-generated signals are fed to the input terminals 1 and 6 of a dual peripheral positive NAND driver logic circuit IC3. The integrated circuit IC3 includes a pair of NAND gates NG1 and NG2 which are connected to the base electrodes of a pair of NPN amplifier driver transistors Q1 and Q2, respectively. It will be seen that the other input terminals 2 and 7 of the NAND gates NG1 and NG2 are connected to the respective output terminals A0 and A1 of the peripheral interface circuit IC1. The emitter electrodes of transistors Q1 and Q2 are directly connected to ground while the collector electrode of transistor Q1, namely, output terminal 3 of the integrated circuit IC3, is connected to a voltage divider network including resistors R1 and R2. That is, the output terminal 3 is connected to the lower end of resistor R2 while the upper end of resistor R1 is connected to terminal +B of a suitable sorce of d.c. supply voltage. The junction point of resistors R1 and R2 is connected to the base electrode of a PNP switching amplifier transistor Q3. The emitter electrode of transistor Q3 is connected by load resistor R3 to the positive supply terminal +B while the collector electrode of transistor Q3 is connected to the upper end of a primary winding P1 of a transformer T1. The lower end of primary winding P1 is directly connected to ground. As shown, the transformer T1 includes a center-tapped secondary winding which is connected to a full-wave rectifier BR1 including diodes D1 and D2. That is, the anode electrode of diode D1 is connected to the upper end of the secondary winding S1 while the anode electrode of diode D2 is connected to the lower end of secondary winding S1. It will be seen that the cathode electrodes are connected together to the positive supply lead +L1 while the center tap of the secondary winding S1 is connected to the negative supply lead −L1.

It will be noted that the collector electrode of transistor Q2, namely, output terminal 5 of the integrated circuit IC3, is connected to a voltage divider network including resistors R4 and R5. That is, the output terminal 5 is connected to the lower end of resistor R5 while the upper end of resistor R4 is connected to the positive supply terminal +B. The junction point of the resistors R4 and R5 is connected to the base electrode of a PNP switching amplifier transistor Q4. The emitter electrode of transistor Q4 is connected by a load resistor R6 to the positive supply terminal +B while the collector electrode is coupled to the upper end of the primary winding P2 of transformer T2. The lower end of the primary winding P2 is directly connected to ground. As shown, the transformer T2 includes a center-tapped secondary winding S2 which is connected to a full-wave rectifier BR2 including diodes D3 and D4. That is, the anode electrode of diode D3 is connected to the upper end of the secondary winding S2 while the anode electrode of diode D4 is connected to the lower end of the secondary winding S2. It will be noted that the cathode electrodes of diodes D3 and D4 are connected together to the positive supply lead +L2 while the center tap of the secondary winding S2 is connected to the negative supply lead −L2.

In viewing FIG. 1B, it will be shown that the voltages on the supply leads +L1, −L1 and +L2, −L2 determine the polarity of the d.c. voltage that is developed on the output terminals T1 and T2, respectively. That is, if due to an a.c. signal on transformer T1, the lead +L1 develops a voltage positive with respect to lead −L1, the output terminal OT2 will be positive by nearly the same amount with respect to output terminal OT1; and conversely, an a.c. signal on transformer T2 will cause lead +L2 to be positive with respect to lead −L2, causing output terminal OT1 to be positive with respect to output terminal OT2. The bipolar voltage appearing on terminals OT1 and OT2 are conveyed to two pairs of parallel-connected polarized electromagnetic relays which control the operations of the two remotely-located switch machines and the corresponding signal aspects. In practice, the switch machines are movable between two extreme positions, namely, normal and reverse; while the signal aspects may display a green signal light GO or a red signal light STOP to trains approaching either on the main line or spur tracks.

One of the most obvious ways to attempt to have the voltages on leads +L1 and −L1 or leads +L2 and −L2 cause similar but opposite polarity voltages to appear on output terminals OT1 and OT2 would be the use of a steering diode-type of circuit. However, it becomes readily apparent that such an attempt will not work since the diodes used for the +L1 and −L1 voltage will block that of the +L2 and −L2 voltage, and vice-versa. Accordingly, it was necessary to develope the unique method of employing steering transistor switches for the subject interface driver circuit.

It will be seen that the d.c. voltage supply leads +L1, −L1, +L2 and −L2 are connected to a pair of NPN steering switching transistors Q5 and Q6. As shown, the positive voltage supply lead +L1 is connected to the collector electrode of transistor Q5 while the negative or common supply lead −L1 is connected to the emitter electrode of steering transistor Q5, which is also the common return point for the components which are associated with the transistors Q5 and Q6. A filter capacitor C1 is connected across the supply leads +L1 and −L1 to suppress ripple and/or spurious noise. A voltage dividing network including resistors R7 and R8 is connected across supply leads +L1 and −L1. It will be noted that the positive voltage supply lead +L2 is connected to the collector electrode of steering transistor Q6 while the negative or common supply lead −L2 is connected to the emitter electrode of transistor Q6. A filter capacitor C2 is connected across the supply leads +L2 and −L2 for suppressing a.c. ripple and/or transient surges. A voltage divider including resistors R9 and R10 is connected across supply leads +L2 and −L2. As shown, the junction point between the voltage dividing resistors R7 and R8 is connected to the base electrode of transistor Q6 while the junction point between the voltage dividing resistors R9 and R10 is connected to the base electrode of transistor Q5. A diode D5 has its cathode electrode connected to the base electrode of transistor Q5 and has its anode electrode connected to the emitter electrode of transistor Q5 while a diode D6 has its cathode electrode connected to the base electrode of transistor Q6 and has its anode electrode connected to the emitter electrode of transistor Q6. The diodes D5 and D6 function to limit the reverse voltage appearing across the base-emitter junctions to prevent damage to the transistors. When lead +L1 is energized, transistor Q6 is turned ON via resistor R7 thereby connecting output terminal OT1 to the common return of this circuit which includes lead −L2. Since transformer T2 is connected to lead +L1, then the output terminal OT2 will be positive. Conversely, when lead +L2 is energized, transistor Q5 connects output terminal OT2 to lead −L1, and therefore output terminal OT1 is positive. Thus, the voltages from leads +L1 and −L1 or +L2 and −L2 will appear across the output terminals OT1 and OT2 with the desired opposite polarities without any interference.

It will be appreciated that since microprocessors are not fail-safe in nature, it is necessary to construct a relay driving circuit in such a fashion that monitoring signals are returned to the microprocessor. Thus, the monitoring signal permits a check that the desired action has indeed been initiated or started. In order to accomplish this function, it will be seen that monitoring circuits MC1 and MC2 are connected across supply lead +L1, −L1 and +L2, −L2, respectively. As shown, the circuit MC1 includes a current-limiting resistor R11 having its upper end connected to the positive supply lead L1 and having its lower end connected to the cathode electrode of diode D7 and the anode electrode of a light-emitting diode D8 of an optical coupler OC1. The anode electrode of diode D7 and the cathode electrode of the light-emitting diode D8 are directly connected to the negative supply lead −L1. The optical coupler includes a light-responsive transistor Q7 which has its collector electrode coupled to a positive supply voltage V via load resistor R12 and which has its emitter electrode directly connected to ground. The collector electrode of transistor Q7 is connected to the input terminal B1 via lead L5. It will be seen that the monitoring circuit MC2 includes a current-limiting resistor R13 having its upper end connected to positive supply lead +L2 and having its lower end connected to the cathode electrode of diode D9 and the anode electrode of light-emitting diode D10 of an optical coupler OC2. The anode electrode of diode D9 and the cathode electrode of light-emitting diode D10 are directly connected to the negative supply lead −L2. The optical coupler OC2 includes a light-responsive transistor Q8 which has its collector electrode coupled to a positive supply voltage +V via resistor R13 and which has its emitter electrode directly connected to ground. The collector electrode of the light-responsive transistor is connected to the input terminal B0 via lead L6. Further, it will be noted that a transient suppressing varistor MOV1 is connected across output wires W1 and W2 to suppress any voltage surges or spikes which may appear across wires W1 and W2 and terminals OT1 and OT2.

In describing the operation of the interface relay driving circuit, it is initially assumed that it is desired to shift or move the switch machines to their normal positions. Under this assumed condition, the microprocessor causes the peripheral interface adapter circuit IC1 to produce a high signal on output terminal A0 and a low signal on the output terminal A1 which are applied to one of the input terminals of the two input gates NG1 and NG2. As previously mentioned, the clock pulses are fed to the other inputs of both of the NAND gates NG1 and NG2 so that the NAND gate NG1 produces a series of square-wave pulses which correspondingly turn the transistors Q1 and Q3 ON and OFF. Thus, the pulsating current flowing through the primary winding P1 induces a.c. signals in the secondary winding S1 of transformer T1. The a.c. signals are rectified by the diodes D1 and D2 of the full-wave rectifier BR1 to produce a positive d.c. control voltage on lead +L1 relative to the negative or common lead −L1. The biasing voltage developed across resistor R8 of the voltage divider R7, R8 causes the transistor Q6 to turn ON so that terminal OT1 and wire W1 are connected to common lead −L2 and cause leads +L2 and −L2 to be short-circuited. This ensures that the light-sensitive transistor Q8 is extinguished so that lead L6 is at +V voltage which causes a high signal to appear on input terminal B0. Conversely, the d.c. voltage across leads +L1 and −L1 causes the light-emitting diode D8 to illuminate so that the light-responsive transistor Q7 is turned ON. The conduction of light-responsive transistor Q7 causes the lead L5 to be grounded so that a low signal will appear on input terminal B1. Thus, the B0 and B1 feedback inputs confirm the fact that wire W2 or output terminal OT2 is at a positive level and that wire W1 or terminal OT1 is at a negative level. Thus, it may be assured that the appropriate polarized relays are energized and that the switch machines have started to move the switch points to their normal positions. It will be appreciated that the switch machines provide a contact closure when the switch points have reached and are locked in their extreme positions. In practice, this contact closure may be used by the microprocessor to check that the desired operation has been completed and to cause the removal of the high signal from output terminal A0. Thus, the switching of transistors Q1 and Q2 ceases and the transistor Q6 is turned OFF, and the positive and negative d.c. voltages are removed from terminal OT2 and OT1, respectively.

Now, if it is desired to move the switch points to their reverse positions, the microprocessor causes the output terminal A0 of peripheral interface adapter circuit IC1 to be low while the output terminal A1 will become high. Under this condition, the NAND gates NG2 produce a series of squarewave pulses corresponding to the clock pulses so that switching transistors Q2 and Q4 are turned ON and OFF to supply a.c. current to transformer T2. Thus, the primary winding P2 induces a.c. signals into the secondary winding S2 which are rectified by diodes D3 and D4 of full-wave rectifier BR2. Accordingly, a positive d.c. voltage is developed on lead +L2 and is conveyed directly to wire W1 and terminal OT1. The voltage-drop across resistor R10 of the voltage dividing network R9, R10 turns ON transistor Q5 which ties the negative lead −L2 to wire W2 and terminal OT2. Ergo, a positive voltage is developed on terminal OT1 and a negative voltage is developed on terminal OT2. The voltage across leads +L2 and −L2 illuminates the light-emitting diode D10 to turn ON light-responsive transistor Q8. The conduction of transistor QB ties its collector electrode to ground so that a low signal is developed on lead L6 which is conveyed to input terminal B0 while the nonconduction of transistor Q7 causes a high signal to be developed on lead L5 and, in turn, on input terminal B1. Thus, the low and high signals on inputs B0 and B1, respectively, are a check that indicated that the switch points are being moved to their reverse positions. Upon reaching their reverse positions, a contact closure causes the microprocessor to remove the outputs on terminals A0 and A1. Accordingly, the bipolar driver circuit reverts to its quiescent condition in which there is a minimum amount of power consumption; and little, if any, deterioration of the circuit elements. It will be seen that during the nonswitching periods, most of the circuit that is situated to the right of integrated circuit IC3 does not consume any power. That is, the transistors Q3, Q4, Q5 and Q6; the transformers T1 and T2; the diodes D1, D2, D3, D4, D5, D6, D7 and D9; the capacitors C1 and C2; and the light-emitting diodes D8 and D10 of the optical couplers OC1 and OC2 are not consuming power. The photoresponsive transistors Q7 and Q8 have collector voltage +V applied at all times, but no collector current flows except for the brief periods that the bipolar relays are energized. Thus, the major portion of the circuitry is entirely deenergized except for the time when an output voltage is to be supplied to the relays. Accordingly, the only components that contribute directly to the failure rate are integrated circuits IC1, IC2 and IC3.

It will be appreciated that when the outputs A0 and A1 of the peripheral interface adapter IC1 are both low, then there is no voltage developed across terminals OT1 and OT2 and both of the feedback or check inputs B0 and B1 will be in a high state.

A fourth possible condition may exist, but it is not intended to be used in the present switch interlocking application. It will be appreciated that both outputs A0 and A1 could be both high; however, since the circuit is symmetrical, the input that is initially high will prevail or control the output developed across terminals OT1 and OT2. For example, if output A0 has been high and then A1 is made high, the result is that terminal OT2 remains at a positive d.c. voltage with respect to terminal OT1. This is due to the fact that transistor Q6 remains in a heavily conducting state and short-circuits the d.c. voltage produced by the diodes D3 and D4 of rectifier BR2. It will be observed that resistor R6 is a current-limiter which protects transistor Q4. The same effect occurs if output A1 is initially high and then output A0 is made high. Under this condition, the terminal OT1 remains at a positive d.c. voltage, and the voltage developed by rectifier BR1 is short-circuited by the heavily conducting transistor Q5.

Turning now to FIG. 2, there is shown an alternate embodiment of developing the feedback signals to inputs B0 and B1 of the peripheral interface adapter circuit IC1. It will be seen that for the purposes of convenience only, a single feedback circuit portion is shown and described in FIG. 2. The identical elements or components of FIG. 2 are referenced by the same letters and/or numerals as those in FIG. 1B. It will be seen that the illuminating energy for the light-emitting diode D10 is produced by a separate or auxiliary full-wave rectifier which includes diodes D11 and D12. As shown, the anode electrodes of diodes D11 and D12 are connected to the respective ends of the secondary winding S2 of transformer T2 while the cathode electrodes of diodes D11 and D12 are connected together to form lead +L2'. It will be seen that lead +L2' is connected to the anode electrode of the light-emitting diode D10 via current-limiting resistor R15 while the anode electrode of diode D10 is connected to negative or common lead −L2. Thus, when a.c. signals are induced in secondary winding S2, the two rectifiers are effective in producing two separate d.c. voltage sources.

It will be appreciated that while the presently-described invention finds particular utility in interlockings and switch machine installations, it is readily understood that the subject electronic bipolar interface driver circuit may be used in other fields and applications.

Thus, the present invention has been described in such full, clear, concise and exact terms as to enable any person skilled in the art to which it pertains to make and use the same, and having set forth the best mode contemplated of carrying out this invention. We state that the subject matter, which we regard as being our invention, is particularly pointed out and distinctly claimed in what is claimed. It will be understood that variations, modifications, equivalents and substitutions for components of the above specifically-described embodiment of the invention may be made by those skilled in the art without departing from the spirit and scope of the invention as set forth in the appended claims.

Having thus described the invention, what we claim as new and desire to secure by Letters Patent, is:

1. An interface driver circuit for producing a bipolar voltage on a pair of output terminals comprising, a peripheral interface adapter circuit conditioned by control data to establish a first and a second electrical signal, a logic circuit connected to said peripheral interface adapter circuit said logic circuit having a first gate connected to a source of clock pulses and activated by said first electrical signal and having a second gate connected to said source of clock pulses and activated by said second electrical signal, a first switching amplifier connected to said first gate for generating a.c. signals when said first gate is activated and a second switching amplifier is connected to said second gate for generating a.c. signals when said second gate is activated, a first rectifier connected to said first switching amplifier for converting the a.c. signals of said first switching amplifier to a first d.c. voltage and a second rectifier connected to said second switching amplifier for converting the a.c. signals of said second switching amplifier to a second d.c. voltage, a first switching circuit connected to said first rectifier and conditioned by said first d.c. voltage to produce one polarity of voltage on the pair of output terminals and a second switching circuit connected to said second rectifier and conditioned by said second d.c. voltage to produce the opposite polarity of voltage on the pair of output terminals, and a monitoring circuit connected to said first and second switching circuits and conditioned by said first and second d.c. voltages to verify the polarity of the voltage on the pair of output terminals.

2. An interface driver circuit for producing a bipolar voltage on a pair of output terminals comprising, an integrated peripheral interface adapter circuit conditioned by control data to establish a first and a second electrical signal, a logic circuit connected to said integrated peripheral interface adapter circuit, said logic circuit having a first gate connected to a source of clock pulses and activated by said first electrical signal and having a second gate connected to said source of clock pulses and activated by said second electrical signal, a first switching amplifier connected to said first gate for generating a.c. signals when said first gate is activated and a second switching amplifier is connected to said second gate for generating a.c. signals when said second gate is activated, a first rectifier connected to said first switching amplifier for converting the a.c. signals of said first switching amplifier to a first d.c. voltage and a second rectifier connected to said second switching amplifier for converting the a.c. signals of said second switching amplifier to a second d.c. voltage, a first switching circuit connected to said first rectifier and conditioned by said first d.c. voltage to produce one polarity of voltage on the pair of output terminals and a second switching circuit connected to said second rectifier and conditioned by said second d.c. voltage to produce the opposite polarity of voltage on the pair of output terminals, and a monitoring circuit connected to said first and second switching circuits and conditioned by said first and second d.c. voltages to verify the polarity of the voltage on the pair of output terminals.

3. The interface driver circuit, as defined in claim 2, wherein said first and second gates take the form of two input NAND gating circuits.

4. The interface driver circuit, as defined in claim 3, wherein one of the inputs of the two input NAND gating circuits is connected to said source of clock pulses.

5. The interface driver circuit, as defined in claim 4, wherein an amplifier driver is connected to an output of each of the two input NAND gating circuits.

6. The interface driver circuit, as defined in claim 2, wherein said first switching amplifier is connected to said first rectifier by a first transformer and said second switching amplifier is connected to said second rectifier by a second transformer.

7. The interface driver circuit, as defined in claim 2, wherein said first and second rectifiers take the form of full-wave rectifying networks.

8. The interface driver circuits, as defined in claim 2, wherein each of said switching amplifiers includes a PNP transistor.

9. The interface driver circuit, as defined in claim 1, wherein said monitoring circuits includes a first and a second optical coupler, said first optical coupler is connected to said first switching circuit and said second rectifier and said second optical coupler is connected to said second switching circuit and said first rectifier.

10. The interface driver circuit, as defined in claim 9, wherein said first optical coupler which is connected to said first switching circuit is extinguished when said first switching circuit is rendered conductive and said second optical coupler which is connected to said first rectifier is illuminated by said first d.c. voltage.

11. The interface driver circuit, as defined in claim 9, wherein said second optical coupler which is connected to said second switching circuit is extinguished when said second switching circuit is rendered conductive and said first optical coupler which is connected to said second rectifier is illuminated by said second d.c. voltage.

12. The interface driver circuit, as defined in claim 9, wherein said first and second optical couplers are illuminated by auxiliary full-wave rectifiers which are connected to said switching amplifiers.

13. The interface driver circuit, as defined in claim 2, wherein each of said first and second switching circuits includes an NPN transistor.

14. The interface driver circuit, as defined in claim 2, wherein said monitoring circuits provide feedback signals to said peripheral interface adapter circuit.

15. The interface driver circuit, as defined in claim 2, wherein said peripheral interface adapter circuit is an integrated circuit.

16. The interface driver circuit, as defined in claim 2, wherein said logic circuit is an integral circuit.

17. The interface driver circuit, as defined in claim 2, wherein said first gate and said first switching amplifier, said first rectifier, said first switching circuit, and said first optical coupler being symmetrical with said second gate, said second switching amplifier, said second rectifier, said second switching circuit, and said second optical coupler.

18. The interface driver circuit, as defined in claim 14, wherein said monitoring circuit includes first and second optical couplers each of which takes the form of a light-responsive transistor.

* * * * *